United States Patent
Agata et al.

(10) Patent No.: US 8,257,675 B2
(45) Date of Patent: Sep. 4, 2012

(54) ARTIFICIAL QUARTZ MEMBER, PROCESS FOR PRODUCING THE SAME, AND OPTICAL ELEMENT COMPRISING THE SAME

(75) Inventors: Noriyuki Agata, Tokyo (JP); Shinya Kikugawa, Tokyo (JP); Yutaka Shimizu, Sawagun (JP); Kazumi Yoshida, Tokyo (JP); Masatoshi Nishimoto, Tokyo (JP)

(73) Assignees: Tokyo Denpa Co., Ltd., Tokyo (JP); Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/336,017

(22) Filed: Dec. 16, 2008

(65) Prior Publication Data

US 2009/0104103 A1 Apr. 23, 2009

Related U.S. Application Data

(63) Continuation of application No. PCT/JP2007/062366, filed on Jun. 13, 2007.

(30) Foreign Application Priority Data

Jun. 16, 2006 (JP) ................. 2006-167890

(51) Int. Cl.
*C01B 33/12* (2006.01)
(52) U.S. Cl. ............ 423/335; 117/72; 117/202; 501/54; 501/11; 501/32; 501/22; 65/385; 65/392; 65/378; 252/588
(58) Field of Classification Search .................. None
See application file for complete search history.

(56) References Cited

U.S. PATENT DOCUMENTS

| 4,956,047 | A  | * | 9/1990 | Harris et al. ..................... 117/72 |
| 7,368,403 | B2 |   | 5/2008 | Ikuta et al. |
| 2003/0139277 | A1 |   | 7/2003 | Maxon et al. |
| 2005/0068644 | A1 | * | 3/2005 | Ikuta et al. .................... 359/833 |
| 2006/0110604 | A1 | * | 5/2006 | Mizuguchi et al. ........... 428/426 |

(Continued)

FOREIGN PATENT DOCUMENTS

DE 199 18 001 A1 10/1999

(Continued)

OTHER PUBLICATIONS

Journal: Robert R. Irvine, Jonathan Foise, Edward Lesson and Gary Johnson; "Recent experiments in a silver lined autoclave (quartz growth)" 42nd Annual Frequency Control Symposium, Jun. 1, 1988, pp. 127-137, XP010076401.*

(Continued)

*Primary Examiner* — Melvin C Mayes
*Assistant Examiner* — Smita Patel
(74) *Attorney, Agent, or Firm* — Oblon, Spivak, McClelland, Maier & Neustadt, L.L.P.

(57) ABSTRACT

An object of the present invention is to provide an artificial quartz member inhibited from suffering the decrease in transmittance in a laser light wavelength region which is caused by long-term irradiation with a laser light having a wavelength of 200 nm or shorter; and a process for producing the artificial quartz member. The invention provides an artificial quartz member for use as an optical element to be irradiated with a laser light having a wavelength of 200 nm or shorter, having an aluminum content of 200 ppb or lower.

8 Claims, 2 Drawing Sheets

U.S. PATENT DOCUMENTS

| | | |
|---|---|---|
| 2006/0183623 A1 | 8/2006 | Ikuta et al. |
| 2008/0292881 A1 | 11/2008 | Takata et al. |
| 2008/0292882 A1 | 11/2008 | Agata et al. |

FOREIGN PATENT DOCUMENTS

| | | |
|---|---|---|
| EP | 1 081 106 A1 | 3/2001 |
| JP | 10-053432 | 2/1998 |
| JP | 10053432 * | 2/1998 |
| JP | 2001-10897 | 1/2001 |
| WO | 03-057633 | 7/2003 |
| WO | WO 2005/005694 | 1/2005 |

OTHER PUBLICATIONS

JP2005-075685, Kenji et al "Method for growing seed quartz for artificial quartz", published date:Mar. 24, 2005, machine translation.*

JP Pub No. JP60-071519 (app#58-17707) Sachio et al. "Manufacturing of crystalline aluminosilicate", published date: Apr. 23, 1985, machine translation abstract.*

Koichi Kajihara, "Improvement of Vacuum-Ultraviolet Transparency of Silica Glass by Modification of Point Defects", Journal of the Ceramic Society of Japan, 115 (2), 2007, pp. 85-91.

Kirk-Othmer, "Recycling, Oil to Silicon", Encyclopedia of Chemical Technology, Fourth Edition, vol. 21, pp. 976-1005, 1032-1085.

Yoko Usami, et al., "Growth and optical characterization of alpha quartz crystals", Proceedings of the 50th Symposium on Synthetic Crystals, Nov. 4, 2005, 17 pages. (with English Translation)

Yoko Usami, et al., "Growth and optical characterization of alpha quartz crystals", Proceedings of Piezoelectric Materials & Devices Symposium 2006, Feb. 15, 2006, 19 pages. (with English Translation)

Irvine R. et al., "Recent experiments in a silver lined autoclave (quartz growth)" $42^{nd}$ Annual Frequency Control Symposium, Jun. 1, 1998, pp. 127-137.

Office Action drafted Feb. 2, 2009 in JP Application No. 2006-167890 (With English Translation).

Office Action issued on May 30, 2011 in the corresponding Russian Patent Application No. 2009101197/15(001459).

* cited by examiner

US 8,257,675 B2

ARTIFICIAL QUARTZ MEMBER, PROCESS FOR PRODUCING THE SAME, AND OPTICAL ELEMENT COMPRISING THE SAME

CROSS-REFERENCE TO RELATED APPLICATIONS

The present application is a continuation of International patent application PCT/JP2007/062366, filed on Jun. 13, 2007, which claims priority to Japanese patent application JP 2006-167890, filed on Jun. 16, 2006.

TECHNICAL FIELD

The present invention relates to an artificial quartz member suitable for use as an optical element to be irradiated with a laser light having a wavelength of 200 nm or shorter, such as ArF excimer laser light. The invention further relates to a process for producing the member and an optical element for ArF lithography comprising the artificial quartz member.

BACKGROUND ART

In the production of semiconductor integrated circuits, lithographic exposure tools for reductively projecting and transferring a fine circuit pattern drawn in a photomask onto a wafer are extensively used. With the trend toward higher degrees of integration and higher functions in circuits, the circuits are becoming finer, and the lithographic exposure tools have come to be required to form a high-resolution circuit pattern image on a wafer surface with a deep focal depth. The wavelengths of exposure lights are becoming shorter. ArF excimer lasers (wavelength, 193 nm) are being used as the exposure light in place of the g-line (wavelength, 436 nm) and i-line (wavelength, 365 nm) heretofore in use.

Recently, the technique of immersion exposure (ArF immersion lithography) is known in which exposure with a lithographic exposure tool is conducted while filling the space between the projection lens of the lithographic exposure tool and the wafer with a liquid in order to attain a higher resolution with an ArF excimer laser. The shorter the exposure light wavelength and the larger the NA (numerical aperture) of the projection lens, the higher the resolution of the lithographic exposure tool. The resolution can be represented by the following expressions.

Resolution=[$k$(process coefficient)×$\lambda$(exposure light wavelength)]/NA

NA=$n$×sin θ

In the expressions, n indicates the refractive index of the medium through which the exposure light passes. In ordinary techniques, n is 1.0 because the medium is the air. However, in the immersion exposure, pure water, which has an n of 1.44, is used as the medium and the lithographic exposure tool can hence attain an even higher resolution.

Furthermore, the technique of polarizing exposure is known in which polarized lights which exert an adverse influence on resolution are diminished to thereby increase image-forming contrast and improve resolution, in contrast to the exposure techniques heretofore in use which employ an exposure light composed of random polarized lights having various polarization directions.

In lithographic exposure tools for use in the immersion exposure, polarization exposure or general exposure to ArF excimer laser light, quartz, which is a birefringent crystalline material having a high transmittance and excellent resistance to laser lights, relatively inexpensive and easy to process, is attracting attention as a material for optical elements, e.g., optical elements concerning polarization, such as polarizers, depolarizers or wavelength plates, and optical diffraction elements such as diffraction lenses.

However, it has been ascertained that optical elements produced from quartz deteriorate in optical properties, e.g., light transmittance, when irradiated over long with a short-wavelength light having high output, such as an excimer laser light.

In order to overcome such a problem, patent document 1 discloses the following artificial quartz members (1) to (4).

(1) An artificial quartz member for use as an optical element to be irradiated with a pulsed laser light having a wavelength shorter than 1,600 nm and a pulse duration shorter than 100 ns, characterized in that when the quartz member is irradiated with $5.0\times10^7$ pulses of ArF excimer laser light having a fluence of 500 mJ/cm$^2$, lowering of the refractive index of an ordinary ray or extraordinary ray generated at the irradiated part is 50 ppm or less.

(2) An artificial quartz member for use as an optical element to be irradiated with a pulsed laser light having a wavelength shorter than 1,600 nm and a pulse duration shorter than 100 ns, characterized in that when the quartz member is irradiated with $5.0\times10^7$ pulses of ArF excimer laser light having a fluence of 500 mJ/cm$^2$, the height of the expanded irradiated part is 20 nm or less.

(3) An artificial quartz member for use as an optical element to be irradiated with a pulsed laser light having a wavelength shorter than 1,600 nm and a pulse duration shorter than 100 ns, characterized in that when the quartz member is irradiated with $5.0\times10^7$ pulses of ArF excimer laser light having a fluence of 500 mJ/cm$^2$, the amount of induced birefringence is 90 nm/cm or less.

(4) An artificial quartz member for use as an optical element which transmits visible light and lights having shorter wavelengths than visible light, characterized in that the homogeneity in refractive index of an ordinary ray or extraordinary ray is 100 ppm or less.

However, (1) to (4) above merely show optical properties required of artificial quartz members to be used as an optical element, and it is not taught therein as to what artificial quartz member has such optical properties. Furthermore, no means for producing each of the artificial quartz members (1) to (4) is shown in patent document 1, and it is necessary to select an artificial quartz member having the above-mentioned optical properties from many artificial quartz members produced. The artificial quartz members which were not selected reduce the yield.

Patent Document 1: JP-A-2005-289693

DISCLOSURE OF THE INVENTION

An object of the invention, which is for eliminating the problems described above, is to provide: an artificial quartz member inhibited from suffering the decrease in transmittance in a laser light wavelength region or in a region of wavelengths not longer than 800 nm which is caused by long-term irradiation with a laser light having a wavelength of 200 nm or shorter, such as ArF excimer laser light; and a process for producing the artificial quartz member.

Another object of the invention is to provide an optical element for ArF lithography which comprises the artificial quartz member.

Other objects and effects of the present invention will become apparent from the following description.

In order to accomplish the objects, the invention provides an artificial quartz member for use as an optical element to be irradiated with a laser light having a wavelength of 200 nm or shorter, having an aluminum content of 200 ppb or lower.

The artificial quartz member of the invention preferably has a sodium content of 100 ppb or lower.

The artificial quartz member of the invention preferably has a lithium content of 150 ppb or lower.

The invention further provides a process for producing the artificial quartz member of the invention, comprising growing an artificial quartz from a starting artificial quartz which has been grown by hydrothermal synthesis and optionally repeating the growing step, thereby yielding an artificial quartz having an aluminum content of 200 ppb or lower.

The invention furthermore provides an optical element for ArF lithography comprising the artificial quartz member of the invention.

In the artificial quartz member of the invention, the decrease in transmittance in a laser light wavelength region which is caused by long-term irradiation with a laser light having a wavelength of 200 nm or shorter, such as ArF excimer laser light, is diminished. Therefore, the artificial quartz member is suitable for use as an optical member for lithographic exposure tools employing ArF excimer laser light. In particular, it is suitable for use as an optical member for ArF immersion lithography.

According to the process of the invention for artificial quartz member production, an artificial quartz member having desired optical properties is not selected from many artificial quartz products but can be directly produced.

The optical element of the invention for ArF immersion lithography deteriorates little in optical properties even when irradiated over long with a laser light having a wavelength of 200 nm or shorter. Therefore, the cycle of optical-element replacement can be prolonged.

BEST MODE FOR CARRYING OUT THE INVENTION

Figure 1:
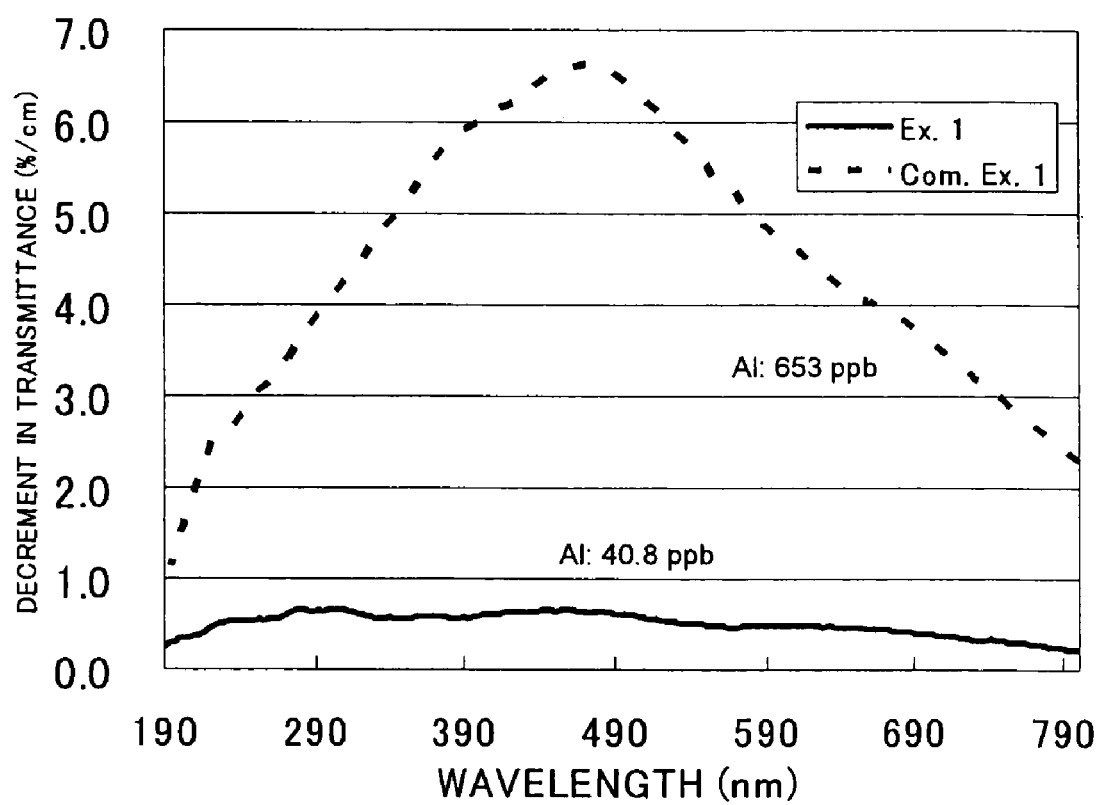
FIG. 1 is a graphic presentation showing the relationship between wavelength region and decrement in transmittance with respect to the optical elements of Example 1 and Comparative Example 1.

The invention will be explained below.

The artificial quartz member of the invention is an artificial quartz member for use as an optical element to be irradiated with a laser light having a wavelength of 200 nm or shorter, having an aluminum content of 200 ppb or lower.

The present inventors made intensive investigations on the decrease in transmittance in a laser light wavelength region which is caused in the case where artificial quartz members are subjected to long-term irradiation with a laser light having a wavelength of 200 nm or shorter, such as ArF excimer laser light. As a result, they reached a conclusion that aluminum (Al) contained as an impurity in artificial quartz members is a cause of the decrease in laser light transmittance in artificial quartz members.

The phrase "the case where artificial quartz members are subjected to long-term irradiation with a laser light" is meant to include both the case where an artificial quartz member is continuously irradiated with a laser light over long and the case where an artificial quartz member is intermittently and repeatedly irradiated with a laser light over long. The mode of laser light irradiation may be either irradiation with a continuous light or pulsed irradiation.

The mechanism by which the transmittance of an artificial quartz member in a laser light wavelength region (wavelengths of 200 nm and shorter) is reduced by aluminum contained therein is as follows.

There are cases where aluminum ($Al^{3+}$) contained in an artificial quartz member replaces silicon ($Si^{4+}$) in the crystal structure of the quartz ($SiO_2$) for some cause. When an artificial quartz member in which such replacement by aluminum has occurred is irradiated with a laser light having a wavelength of 200 nm or shorter over long, then the trivalent aluminum ($Al^{3+}$) introduced into the crystal structure by replacement is excited to become tetravalent aluminum ($Al^{4+}$). The $Al^{4+}$ excited absorbs light rays in a wide wavelength region (e.g., 190-800 nm). Therefore, the artificial quartz member in which $Al^{4+}$ has generated has a reduced transmittance in the laser light wavelength region, i.e., wavelengths of 200 nm and shorter. Incidentally, since the generation of $Al^{4+}$ results in the absorption of light rays in the above-mentioned wide wavelength region (covering almost the whole visible-light wavelength region), the artificial quartz member assumes a blackish gray color. The generation of $Al^{4+}$ can hence be visually ascertained.

In the case where $Si^{4+}$ in an artificial quartz has been replaced by $Al^{3+}$, this artificial quartz is deficient in monovalent cation. To compensate for the deficiency, a monovalent cation is incorporated. The monovalent cation for charge compensation needs not be particularly specified. However, in the actual growth of an artificial quartz, there are frequently cases where lithium ($Li^+$), which has the smallest ionic radius among the monovalent cations contained in the raw material of the artificial quartz, such as $Li^+$, $Na^+$, and $K^+$, is incorporated into the crystal.

Since the artificial quartz member of the invention has an aluminum content as extremely low as 200 ppb or below, the possibility that the $Al^{3+}$ contained as an impurity in the artificial quartz member might replace the silicon ($Si^{4+}$) in the crystal structure of the quartz is considerably lowered. As a result, the decrease in transmittance in the laser light wavelength region which is caused by long-term irradiation with a laser light having a wavelength of 200 nm or shorter is inhibited.

The aluminum content of the artificial quartz member of the invention is preferably 100 ppb or lower, more preferably 50 ppb or lower.

It is preferred that the content of lithium as an impurity in the artificial quartz member of the invention should be 150 ppb or lower because such a low lithium content is effective in diminishing the decrease in internal transmittance by a laser light. The lithium content of the artificial quartz member is more preferably 100 ppb or lower, further preferably 50 ppb or lower, especially preferably 30 ppb or lower.

Incidentally, the aluminum content and lithium content in the artificial quartz member and the contents of sodium and other elements therein, which will be described below, can be determined by ICP mass spectrometry.

It is preferred that the content of sodium as an impurity in the artificial quartz member of the invention should be 300 ppb or lower because such a low sodium content is effective in diminishing the decrease in internal transmittance by a laser light.

The sodium content of the artificial quartz member is more preferably 100 ppb or lower, further preferably 50 ppb or lower, especially preferably 30 ppb or lower.

It is preferred that the content of impurities other than aluminum, lithium and sodium (hereinafter referred to as "other impurities") in the artificial quartz member of the invention should be 100 ppb or lower in total. Examples of the other impurities include K, Ni, Cu, Mg, Cr, Zn, Ca, Ce, Mn, Ag, Cd, Pb, Sn, Co, Ge and Fe.

The content of the other impurities in the artificial quartz member of the invention is more preferably 80 ppb or lower, further preferably 40 ppb or lower, in total.

The process for producing the artificial quartz member of the invention is explained below.

In general, in the case where an artificial quartz member is to be used as an optical element, an artificial quartz (member) grown by hydrothermal synthesis using a natural quartz (lasca) as a raw material is processed into a desired shape and used as the optical element. In producing the artificial quartz member of the invention, a procedure in which an artificial quartz grown from a natural quartz is used as a raw material to conduct further hydrothermal synthesis and thereby grow a new artificial quartz is conducted once or repeatedly conducted two or more times. Thereby, the aluminum content of the artificial quartz is regulated to 200 ppb or lower.

By growing a new artificial quartz using an artificial quartz as a raw material, the content of impurities in the artificial quartz is reduced. By conducting this procedure once or repeatedly conducting it two or more times, the content of aluminum contained as an impurity in the artificial quartz can be reduced to 200 ppb or lower.

At the time when an artificial quartz grown from a natural quartz as a raw material is used as a raw material for growing a new artificial quartz, it is preferred to remove part of the artificial quartz which has a high impurity content. In an artificial quartz grown by hydrothermal synthesis, the part grown in the X-axis direction (+/− X region) (generally) has a higher impurity content than the main-growth part, i.e., the part grown in the Z-axis direction (pure Z region). Therefore, when an artificial quartz grown from a natural quartz as a raw material is used as a raw material for growing a new artificial quartz, it is preferred to use the quartz from which the +/− X region has been removed. Thus, the artificial quartz newly grown can have a further reduced impurity content. In the case where the procedure in which an artificial quartz is used as a raw material to grow a new artificial quartz is repeatedly conducted two or more times, it is preferred to use the quartz from which the +/− X region has been removed also at the time when the artificial quartz obtained by the first operation is used as a raw material to grow a new artificial quartz.

In the case where the procedure for growing a new artificial quartz is repeatedly conducted two or more times, the number of repetitions thereof may be determined based on either of the following ways of thinking.

(1) Each time a new artificial quartz is grown, a sample piece is taken from the grown artificial quartz and analyzed for composition to ascertain the contents of impurities in the artificial quartz. In the case where the aluminum content and lithium content in this artificial quartz have been reduced to desired values (e.g., an aluminum content of 200 ppb or lower and a lithium content of 150 ppb or lower), the procedure for artificial-quartz growth may be terminated at this point of time. On the other hand, in the case where the aluminum content and lithium content in the artificial quartz are higher than those values, the procedure for artificial-quartz growth is conducted again using the grown artificial quartz as a raw material.

(2) A sample obtained after conducting the procedure for artificial-quartz growth once, a sample obtained after repeatedly conducting the procedure twice, a sample obtained after repeatedly conducting the procedure thrice, etc. are produced beforehand, and each sample is analyzed for composition. From this analysis, information on the aluminum content and lithium content in the artificial quartz is obtained with respect to each number of repetitions of the procedure for artificial-quartz growth. Based on the information thus obtained, the number of repetitions of the procedure for artificial-quartz growth to be conducted is determined.

The optical element of the invention is obtained by processing the artificial quartz member obtained by conducting the procedure described above into a desired shape. The optical element of the invention is suitable for use as an optical element to be irradiated with a laser light having a wavelength of 200 nm or shorter, e.g., an optical element for ArF excimer lasers. Examples of such optical elements include optical elements concerning polarization such as polarizers, depolarizers, or wavelength plates such as quarter wavelength plates. Examples thereof further include optical diffraction elements such as diffraction lenses.

The optical element of the invention is especially suitable for use as an optical element for ArF immersion lithography.

The shape and size of the optical element are appropriately selected according to the kind and application of the optical element. In the case of the optical elements shown above as examples, the dimensions thereof are generally 85-150 mm in diameter and 0.5-2 mm in an optical-direction thickness.

EXAMPLES

The present invention will be illustrated in greater detail with reference to the following Examples, but the invention should not be construed as being limited thereto.

Examples 1 and 2

A natural quartz (lasca) was used as a raw material to grow an artificial quartz ingot a by hydrothermal synthesis. The artificial quartz ingot a from which the part grown in the X-axis direction had been removed was used as a raw material to grow a new artificial quartz ingot A. A rectangular plate was cut out of the artificial quartz ingot A obtained, and subjected to precise grinding and polishing to obtain optical elements A and B of 20 mm square and 20 mm thick.

Examples 3 and 4

Optical elements C and D of 20 mm square and 5 mm thick were obtained by conducting the same procedure as in Examples 1 and 2.

Examples 5 and 6

Optical elements E and F of 20 mm square and 10 mm thick were obtained by conducting the same procedure as in Examples 1 and 2.

Comparative Example 1

A rectangular plate was cut out of the artificial quartz ingot a, which had been grown from a natural quartz as a raw material. The rectangular plate was subjected to precise grinding and polishing to obtain an optical element G of 20 mm square and 20 mm thick.

Comparative Example 2

A rectangular plate was cut out of the artificial quartz ingot a, which had been grown from a natural quartz as a raw material. The rectangular plate was subjected to precise grinding and polishing to obtain an optical element H which of 20 mm square and 5 mm thick.

The optical elements A to G obtained were subjected to the following evaluation.

Determination of Impurity Contents:

The optical elements obtained were quantitatively evaluated for impurity contents (ppb) with an ICP mass spectrometer (SPQ8000H (Seiko Instruments Inc.)). The results are shown in Table 1.

The component of each optical element other than the impurities shown in Table 1 is $SiO_2$.

TABLE 1

|  | Ex. 1 | Ex. 2 | Ex. 3 | Ex. 4 | Ex. 5 | Ex. 6 | Comp. Ex. 1 | Comp. Ex. 2 |
|---|---|---|---|---|---|---|---|---|
|  |  |  |  | Optical element |  |  |  |  |
|  | A | B | C | D | E | F | G | H |
|  |  |  |  | Thickness (mm) |  |  |  |  |
|  | 20 mm | 20 mm | 5 mm | 5 mm | 10 mm | 10 mm | 20 mm | 5 mm |
| Al (ppb) | 40.8 | 47.3 | 32.7 | 60.8 | 42.0 | 39.9 | 653.0 | 310.8 |
| Li (ppb) | 11.8 | 14.6 | 18.5 | 18.5 | 12.5 | 12.1 | 268.0 | 81.8 |
| Na (ppb) | 16.9 | 15.4 | 23.9 | 27.3 | 11.9 | 10.9 | 302.0 | 5.6 |
| Ge (ppb) | 4.5 | 7.1 | 3.2 | 6.1 | 5.7 | 4.5 | 8.0 | 54.0 |
| Fe (ppb) | 0.8 | 0.8 | ND | ND | ND | 0.8 | ND | ND |

None of K, Ni, Cu, Mg, Cr, Zn, Ca, Ce, Mn, Ag, Cd, Pb, Sn and Co was detected in each optical element.

Evaluation of ArF Laser Light Durability:

The optical elements A, B and G, each having a thickness of 20 mm, were pulse-wise irradiated with ArF excimer laser (wavelength, 193 nm) light under the following conditions.

Lithographic exposure tool: Novaline A2030 (Lambda Physik AG)

Energy density: 5 mJ/cm$^2$/pulse

Pulse duration: 28 nsec

Every time each optical element had been irradiated with a certain number of pulses, the resultant decrease in transmittance of the optical element was determined with a spectrophotometer (Cary 500 (Varian Inc.)). FIG. 1 shows decrements in transmittance (%/cm) in the wavelength region of 190-790 nm as determined at the time when the optical elements A and G are irradiated with 1×10$^9$ pulses of ArF excimer laser light. Herein, the decrement in transmittance indicates the degree of a decrease in transmittance of the optical element at the time when it is irradiated with a certain number of pulses of ArF excimer laser light, based on the transmittance of the optical element before ArF excimer laser light irradiation which is taken as 100%. Specifically, it is represented by the following expression.

$$100 \times \{1 - \exp(-\alpha)\}$$

α: absorption induced per unit length (1 cm)

$\alpha = \ln(T_0/T_x)/t$ $T_0$: transmittance (%) before laser light irradiation $T_x$: transmittance (%) of optical element after x-pulse laser light irradiation t: thickness of the optical element (cm)

As apparent from FIG. 1, the optical element G (Comparative Example 1), which had an aluminum content of 653 ppb, showed a noticeable transmittance decrease centering at a wavelength of 490 nm. The laser-irradiated part of the optical element G suffered coloration to blackish gray. In contrast, the optical element A (Example 1), which had an aluminum content of 40.8 ppb, showed almost no transmittance decrease in the wavelength region of 190-490 nm. Furthermore, the laser-irradiated part of the optical element A suffered no coloration.

Figure 2:
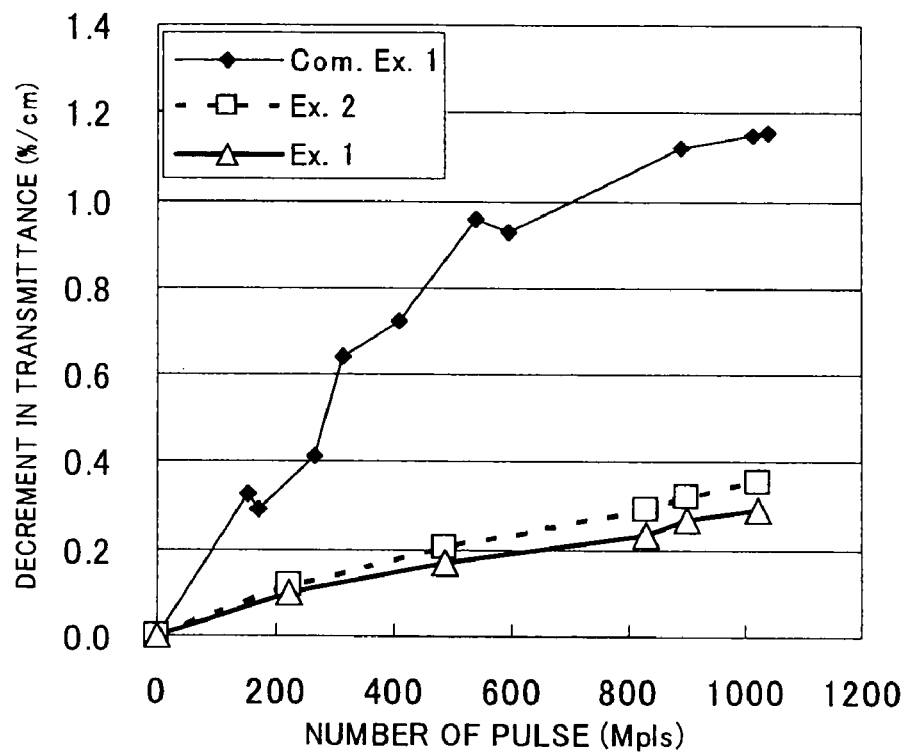
FIG. 2 is a graphic presentation showing the relationship between the number of pulses and decrement in transmittance at a wavelength of 190 nm.
Figure 3:
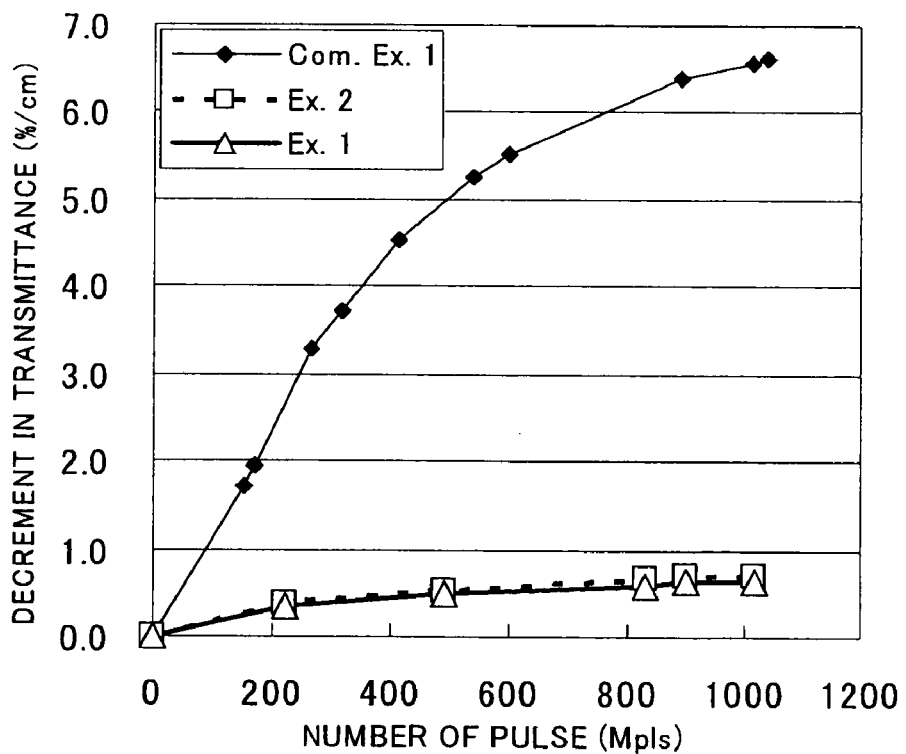
FIG. 3 is a graphic presentation showing the relationship between the number of pulses and decrement in transmittance at a wavelength of 490 nm.

FIG. 2 shows the relationship between the number of pulses and the decrement in transmittance at a wavelength of 190 nm with respect to the optical element A (Example 1), optical element B (Example 2) and optical element G (Comparative Example 1). FIG. 3 shows the relationship between the number of pulses and the decrement in transmittance at a wavelength of 490 nm with respect to the optical element A (Example 1), optical element B (Example 2) and optical element G (Comparative Example 1). As apparent from FIGS. 2 and 3, the optical element G, which had an aluminum content exceeding 200 ppb (653 ppb), showed a noticeable transmittance decrease as the number of pulses increased. In contrast, in the case of the optical elements A and B, which had aluminum contents not higher than 200 ppb (40.8 ppb in A and 47.3 ppb in B), the decrease in transmittance was on an exceedingly low level even when the number of pulses reached 1×10$^9$. In the optical element G, coloration to blackish gray was observed in the laser-irradiated part of the optical element at the time when the number of pulses reached 1×10$^9$. In contrast, in the optical elements A and B, no coloration was observed in the laser-irradiated part of each optical element even when the number of pulses had reached 1×10$^9$.

Industrial Applicability

In the artificial quartz member of the invention, the decrease in transmittance in a laser light wavelength region which is caused by long-term irradiation with a laser light having a wavelength of 200 nm or shorter, such as ArF excimer laser light, is diminished. Therefore, the artificial quartz member is suitable for use as an optical member for lithographic exposure tools employing ArF excimer laser light. In particular, it is suitable for use as an optical member for ArF immersion lithography.

While the present invention has been described in detail and with reference to specific embodiments thereof, it will be apparent to one skilled in the art that various changes and modifications can be made therein without departing from the spirit and scope thereof.

This application is based on Japanese Patent Application No. 2006-167890 filed on Jun. 16, 2006, and the contents thereof are herein incorporated by reference.

The invention claimed is:

1. A process for producing an artificial crystalline quartz member having an aluminum content of 100 ppb or less, a lithium content of 50 ppb or less and a sodium content of 50 ppb or less, wherein the process comprises growing the artificial crystalline quartz member by hydrothermal synthesis from an artificial crystalline quartz raw material which has been grown by hydrothermal synthesis, wherein a +/− X-axis region has been removed from the artificial crystalline quartz raw material before growing the artificial crystalline quartz member.

2. The process according to claim 1, wherein said growing is repeated.

3. The process according to claim 1, wherein the artificial crystalline quartz member has an aluminum content of 50 ppb or less.

4. The process according to claim 1, wherein the artificial crystalline quartz member has a lithium content of 30 ppb or less.

5. The process according to claim 1, wherein the artificial crystalline quartz member has a sodium content of 30 ppb or less.

6. The process according to claim 1, wherein the artificial crystalline quartz member has a content of impurities other than aluminum, lithium and sodium of 100 ppb or less.

7. The process according to claim 1, wherein the artificial crystalline quartz member has a content of impurities other than aluminum, lithium and sodium of 80 ppb or less.

8. The process according to claim 1, wherein the artificial crystalline quartz member has a content of impurities other than aluminum, lithium and sodium of 40 ppb or less.

* * * * *